United States Patent
Boisvert

(10) Patent No.: US 6,730,979 B2
(45) Date of Patent: May 4, 2004

(54) RECESSED P-TYPE REGION CAP LAYER AVALANCHE PHOTODIODE

(75) Inventor: Joseph C. Boisvert, Thousand Oaks, CA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 10/242,120

(22) Filed: Sep. 12, 2002

(65) Prior Publication Data

US 2004/0051165 A1 Mar. 18, 2004

(51) Int. Cl.[7] .......................................... H01L 31/107
(52) U.S. Cl. .................. 257/438; 257/481; 257/603; 257/606
(58) Field of Search ................................. 257/438, 481, 257/603, 606

(56) References Cited

U.S. PATENT DOCUMENTS

| | | | |
|---|---|---|---|
| 3,959,646 A | * 5/1976 | DE Cremoux | 257/438 |
| 4,651,187 A | 3/1987 | Sugimoto et al. | |
| 4,876,209 A | 10/1989 | Forrest | |
| 4,914,494 A | 4/1990 | Webb | |
| 4,949,144 A | 8/1990 | Kuroda et al. | |
| 5,144,381 A | * 9/1992 | Furuyama et al. | 257/186 |
| 5,157,473 A | * 10/1992 | Okazaki | 257/438 |
| 5,189,309 A | 2/1993 | Wada et al. | |
| 5,233,209 A | * 8/1993 | Rodgers et al. | 257/171 |
| 5,670,383 A | 9/1997 | Piccone et al. | |
| 5,866,936 A | 2/1999 | Hasnain et al. | |
| 6,492,239 B2 | * 12/2002 | Yang et al. | 438/380 |

* cited by examiner

*Primary Examiner*—Allan R. Wilson
(74) *Attorney, Agent, or Firm*—Terje Gudmestad

(57) ABSTRACT

A recessed p-type region cap layer avalanche photodiode (12) is provided. The photodiode (12) includes a semiconductor substrate (30) and a semiconductor stack (32), which is electrically coupled to the substrate (30). A cap layer (34) is electrically coupled to the stack (32) and includes a recessed p-type region (36). The recessed p-type region (36) forms a p-n junction (38) with the stack (32). A method of forming the photodiode (12) is also provided. The method includes forming the substrate (30), the stack (32), and the cap layer (34). The cap layer (34) is selectively etched to expose the stack (32) and form a cap layer opening (42). Dopant is diffused through the cap layer opening (42) into the stack (32) to form the p-n junction (38).

10 Claims, 2 Drawing Sheets

RECESSED P-TYPE REGION CAP LAYER AVALANCHE PHOTODIODE

TECHNICAL FIELD

The present invention relates generally to telecommunication transceivers, and more particularly, to a semiconductor avalanche photodiode for use in a transceiver and a method of fabricating the same.

BACKGROUND OF THE INVENTION

Telecommunication transceivers are utilized in various applications to transmit and receive communication signals in telecommunication networks. Fiberoptics are used as a transmission medium between the telecommunication transceivers for various transmission reasons including low noise interference, high-speed data transmission rates, and large multiplexing capabilities. In order for the telecommunication transceivers to receive the communication signals transmitted via light over fiberoptic cable, photodetectors are utilized.

Photodetectors transform light energy into electrical energy. Reverse saturation current is controlled by light intensity that shines on the photodetectors. The light generates electron-hole pairs, which induce current. The resulting current is directly proportional to the light intensity.

The use of fiberoptics introduces practical, feasible, and functional requirements. The photodetectors are preferably semiconductor diodes that are inexpensive due to large quantity requirements, reliable, and capable of relatively high yields. It is also desirable for the photodetectors to provide low noise or low dark current and be amendable to high volume production. One type of photodetector, that is commonly used, that has some of these characteristics including desired detection sensitivity, is an avalanche photodiode (APD).

APDs allow a light induced carrier to be multiplied through an application of a reverse bias p-n junction. An APD is biased near a breakdown region, which causes a cascading effect. As charge is accelerated by a high bias potential that is applied across the p-n junction of the APD, absorption of an incident photon is amplified and charge is generated in amplified proportion to the light intensity.

Current approaches to fabricating reliable planar indium galium arsenic (InGaAs) APDs or planar indium phosphide (InP) APDs utilize either epitaxial growth or double diffusion methods that each have significant limitations.

Epitaxial regrowth methods require that a partially fabricated APD or wafer be removed from an epitaxial growth chamber, exposed to processing including photomasking and etching, and then be placed into a growth chamber for subsequent overgrowth of InP. When using an epitaxial regrowth method, a difficulty arises in returning a wafer impact surface to a pristine or low defect condition. Processing the wafer outside of the epitaxial growth chamber exposes it to particulates, processing chemicals, and other impurities known in the art. Also resulting APDs, of an epitaxial regrowth method, have poor dark current and noise performance characteristics.

Double diffusion methods require careful attention to diffusion parameters and require that a p-n junction be terminated with one or more floating field rings. The floating field rings extend a top surface area of an APD and increase capacitance of the p-n junction without increasing an optically sensitive area or active area. The floating field rings are located at a fixed distance outside the active area so the total junction area and capacitance is increased. Increased p-n junction capacitance undesirably limits bandwidth of the APD. Also, in using a double diffusion method, spatial uniformity of individual layers need to be maintained in order to form a photodiode with relatively uniform process yields across the APD.

Another disadvantage with existing APDs is that there is a large amount of time and costs involved in fiber-optic alignment to the APDs. Since the APDs are high frequency devices that have small capacitances, they have relatively smaller active areas. Small active area devices require active alignment, monitoring the detector with light coming down the fiber-optic, to insure that all of the light is falling inside the active area, within a telecommunication receiver. Difficulty involved in fiber-optic to APD alignment is increased when floating field rings are required, due to increased capacitance of a p-n junction.

There is also a continuous desire to increase performance characteristics of APDs. It is desirable that the APDs exhibit less noise, have increased gain, produce less surface leakage current, and have improved reliability.

It would therefore be desirable to develop an APD that provides low noise, low surface leakage current, high gain, uniform process yields, and is capable of responding to wavelengths within a desired range. It would also be desirable for the APD to exhibit less time consumption and have improved cost effectiveness in alignment with a fiber-optic cable within a telecommunication receiver.

SUMMARY OF THE INVENTION

The present invention provides a semiconductor avalanche photodiode for use in a transceiver and a method of fabricating the same. A recessed p-type region cap layer avalanche photodiode is provided. The photodiode includes a semiconductor substrate and a semiconductor stack, which is electrically coupled to the substrate. A cap layer is electrically coupled to the stack and includes a recessed p-type region. The recessed p-type region forms a p-n junction with the stack. A method of forming the photodiode is also provided. The method includes forming the substrate, the stack, and the cap layer. The cap layer is selectively etched to expose the stack and form a cap layer opening. Dopant is diffused through the cap layer opening into the stack to form the p-n junction.

One of several advantages of the present invention is that a single diffusion is performed into a controlled multiplication layer thickness. The single diffusion eliminates a need for floating field rings and/or guard rings and provides decreased p-n junction capacitance, thereby not limiting bandwidth of the photodiode.

Another advantage of the present invention is that it maintains process uniformity of epitaxial growth and diffusion of dopant over an entire substrate. A uniform diffusion front into the underlying InP multiplication layer is insured and results from a single preferential wet chemical etch that stops on the InP layer. Uniformity of epitaxial growth and diffusion of dopant results in relatively high process yields across the photodiode.

Furthermore, the cap layer of the present invention has a wide-bandgap and is passivated resulting in reduced surface leakage current and improved device reliability over avalanche photodiodes of prior art.

Other advantages and features of the present invention will become apparent when viewed in light of the detailed description of the preferred embodiment when taken in conjunction with the attached drawings and appended claims.

DETAILED DESCRIPTION OF THE PREFERRED EMBODIMENT

Figure 1:
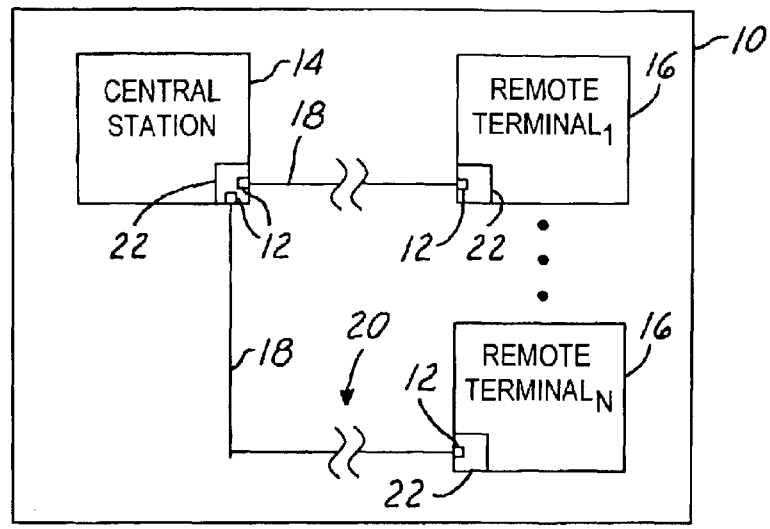
FIG. 1 is a block diagrammatic view of a telecommunication network utilizing avalanche photodiodes formed in accordance with an embodiment of the present invention.

In each of the following figures, the same reference numerals are used to refer to the same components. While the present invention is described with respect to a method and apparatus for an avalanche photodetector (APD) for use in a transceiver and a method of fabricating the same, the present invention may be adapted to be used in various systems and applications including: vehicle systems, control systems, communication systems, semiconductor lasers, photodetectors, photodiodes, fiber optic receiver detectors, solar cells, or other systems or applications that may utilize an APD. It is also understood that the present invention may be applied in forming other semiconductors, other than APDs, known in the art.

In the following description, various operating parameters and components are described for one constructed embodiment. These specific parameters and components are included as examples and are not meant to be limiting.

Also, in the following description the term "semiconductor" may refer to any solid state device such as photodetectors, photodiodes, solar cells, or other solid state device known in the art.

Additionally, the present invention is applicable for low capacitance devices as well as low leakage current devices. In general, low capacitance devices are high-speed devices used in data detection. Low leakage current devices are not high-speed but are low power devices with high capacitance, which may be used, for example, as monitors to detect and correct laser power levels.

Referring now to FIG. 1, a block diagrammatic view of a telecommunication network 10 utilizing APDs 12 formed in accordance with an embodiment of the present invention, is shown. The network 10 includes a central station 14 in communication with multiple remote terminals 16 via fiber optic cable 18. The remote terminals 16 may be a large distance from the central station 14, represented by breaks 20. The central station 14 and the remote terminals 16 have transceivers 22 containing APDs 12 that are fabricated in accordance with methods described in detail below.

Figure 2:
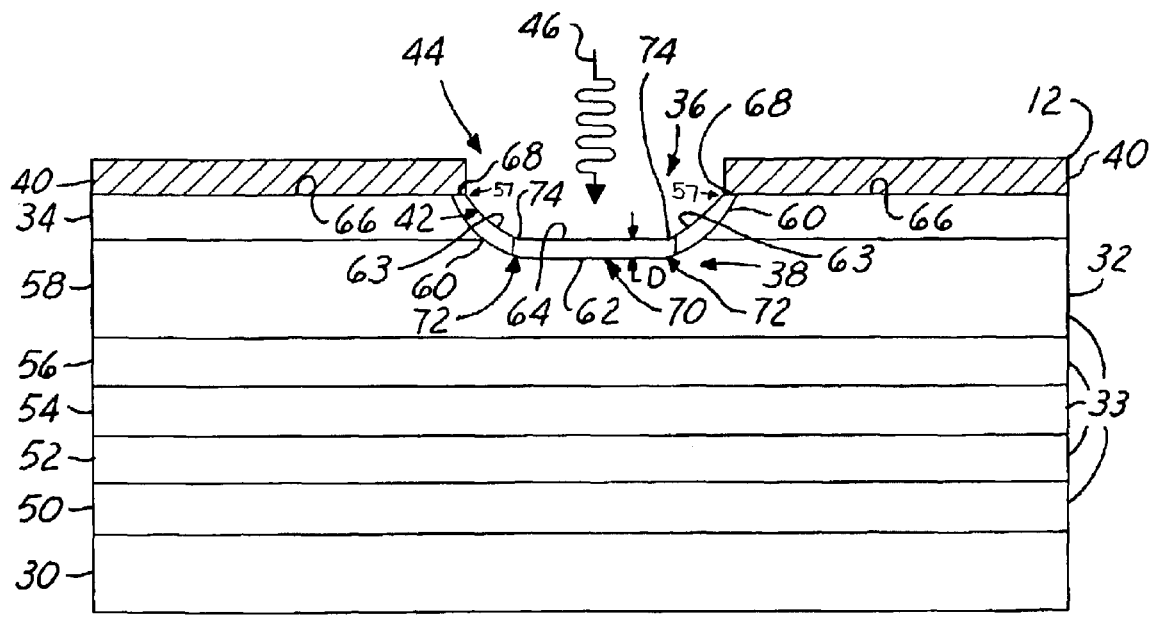
FIG. 2 is a cross-sectional view of an avalanche photodiode formed in accordance with an embodiment of the present invention.

Referring now to FIG. 2, is a cross-sectional view of an APD 12 formed in accordance with an embodiment of the present invention is shown. The APD 12 includes a semiconductor substrate 30 electrically coupled to a semiconductor stack 32, that has multiple layers 33. A cap layer 34 is electrically coupled to the stack 32 and comprises a recessed p-type region 36. The recessed p-type region 36 forms a p-n junction 38 with the stack 32. The cap layer 34 is coated by a passivating dielectric layer 40. The cap layer 34 has a cap layer opening 42 that corresponds with a passivating dielectric layer opening 44 and the p-n junction 38. As light 46 is received at various wavelengths through a passivating dielectric layer opening 44 and the cap layer opening 42 to the p-n junction 38, electrical energy is produced at contacts, not shown.

Many contact configurations are possible, as known in the art. One simple approach is to use a planar backside contact to layer 30 as the cathode and to lay a metal contact into the recess region 36 for the anode. This approach requires that the contacting technique be amenable to a shallow well. Alternative approaches include covering the dielectric layer 40 with a polyimide and placing the metal contact on top of the polyimide when the application does not permit contacting into a shallow well. Another approach may be to run a polyimide planarizing process. A co-planar approach is also possible where the cathode contact is made by etching through the stack 32 to layer 30 and then running conductive material to form the contact.

The stack 32 includes a buffer layer 50 that is electrically coupled to the substrate 30. The buffer layer 50 may be formed of $N^+$-type InP material or other $N^+$-type material known in the art. An absorption layer 52 is electrically coupled to the buffer layer 50 and may be formed of $N^-$-type indium gallium arsenic (InGaAs) or other $N^-$-type material known in the art. A grading layer 54 is electrically coupled to the absorption layer 52 and is formed of N-type indium gallium arsenic phosphide (InGaAsP) or other N-type material known in the art. A field control layer 56 is electrically coupled to the grading layer 54 and is formed of N-type InP or other N-type material known in the art. A multiplication layer 58 is electrically coupled to the field control layer 56 and the cap layer 34 and is formed of $N^-$-type InP or other $N^-$-type material known in the art. Although, in one preferred embodiment of the present invention the stack 32 is formed having the above stated multiple layers 33, the stack 32 may be formed using other combinations of layers, known in the art, that perform similarly to the above stated multiple layers 33.

The cap layer 34 may be formed of $N^-$-type indium aluminum arsenic (InAlAs) or other $N^-$-type similarly performing material known in the art. Using InAlAs as the cap layer is particularly advantageous because this material preferentially avalanches electrons instead of holes, holes are injected into the InAlAs in a preferred embodiment, and the avalanching fields are higher in InAlAs than in InP. Thus, an InAlAs cap will suppress breakdown at a perimeter 57 and reduce hot hole injection into the passivating layer 40, a common failure mechanism in planar InP APDs.

The cap layer 34 includes the recessed p-type region 36. The recessed p-type region 36 has a $P^-$-type sidewall region 60 and a lower $P^+$-type region 62. The sidewall region 60 extends into the multiplication layer 58 to the lower $P^+$-type region 62. The lower $P^+$-type region 62 has a thickness D. The sidewall region 60 may have a single sidewall surface 63 and be a continuous region surrounding an upper surface 64 of the lower $P^+$-type region 62, as shown, or may be discontinuous in that the sidewall region 60 may include multiple sidewall surfaces. The shape of the sidewall region 60 and the thickness D and size of the lower $P^+$-type region 62 may be controlled during formation thereof, using methods known in the art and further described below.

The dielectric layer 40 coats a top surface 66 of the cap layer 40 and extends over an upper edge 68 of the sidewall region 60. The dielectric layer 40 reduces surface leakage current through the top surface 66 and upper edge 68. By reducing leakage current the dielectric layer 40 also increases APD 12 reliability in that the magnitude, consistency, and uniformity of the electrical energy generated by the APD 12 is increased.

In operation, when a sufficient reverse bias voltage is applied across the APD 12 from the lower $P^+$-type region 62 to the buffer layer 50 an electric field results across the multiplication layer 58 that causes photogenerated carriers entering the multiplication layer 58 to impact, ionize or avalanche, and create an internal amplification, as known in the art. The lower P+-type region 62 spatially defines the p-n junction 38 where photogenerated carriers created in the absorption layer 52 avalanche to a given gain. Gain refers to a number of carriers collected at the lower P+-type region 62 as a result of one carrier entering the multiplication layer 58.

Dopant concentration decreases rapidly from a center area 70 of the p-n junction 38 to a periphery 72 of the p-n junction 38, thus creating a gradient in dopant concentration between the center area 70 and the periphery 72. This gradient in dopant concentration reduces electrical field at edges 74 of the p-n junction 38 and prevents premature edge breakdown therein. The prevention of premature edge breakdown reduces gain limitation of the APD 12. The cap layer opening 42 inhibits impact ionization at the periphery 72, which also contributes to reducing premature edge breakdown.

In another embodiment of the present invention when the gradient in dopant concentration is not sufficient at the periphery 72 to prevent edge breakdown, floating field rings, not shown, may be also diffused into the cap layer 34. In this embodiment also only a single diffusion is required to establish the proper doping profile. For further diffusion information on floating field rings, U.S. Pat. No. 4,876,209 is incorporated herein by reference.

Figure 3:
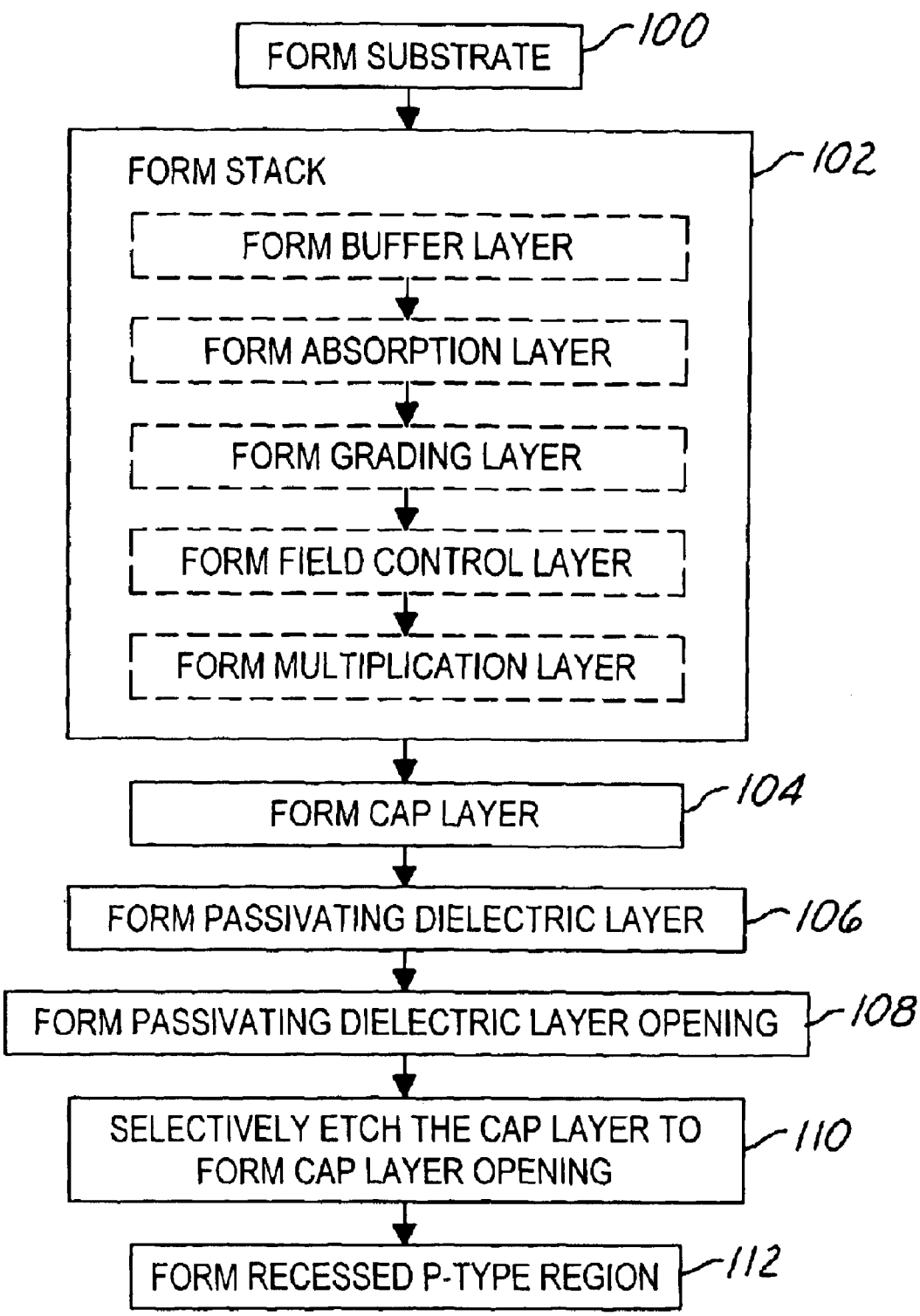
FIG. 3 is a logic flow diagram illustrating a method of fabricating an avalanche photodiode in accordance with an embodiment of the present invention.

Referring now to FIG. 3, a logic flow diagram illustrating a method of fabricating the APD 12 in accordance with an embodiment of the present invention is shown.

In step 100, the substrate 30 is formed. The substrate 30 is formed using methods known in the art and may be formed of indium phosphide (InP) or other materials or chemical compounds known in the art.

In step 102, the stack 32 is epitaxially grown on the substrate 30. Each layer within the stack 32 is epitaxially grown, one at a time, over a previously epitaxially grown layer. First, the buffer layer 50 is epitaxially grown on the substrate 30. Second, the absorption layer 52 is epitaxially grown on the buffer layer 50. Third, the grading layer 54 is epitaxially grown on the absorption layer 52. Forth, the field control layer 56 is epitaxially grown on the grading layer 54. Fifth, the multiplication layer 58 is epitaxially grown on the field control layer 56. For further information on formation of stack 32, U.S. Pat. No. 4,949,144 is incorporated herein by reference.

In step 104, the cap layer 34 is epitaxially grown on the stack 32.

In step 106, the cap layer 34 is coated to form the dielectric layer 40.

In step 108, the dielectric layer 40 is etched to expose the cap layer 34 and form the dielectric layer opening 44. Photolithography and a dry etching technique, known in the art, are used to form the dielectric layer opening 44.

In step 110, the cap layer 34 is selectively etched to expose the stack 32 and form the cap layer opening 42. A wet etching technique, known in the art, is used to remove a portion of the cap layer 34 and effectively stop on the underlying multiplication layer 58, thus not removing any of the multiplication layer 58. For information on wet etching, "Selective wet etching for InGaAs/InAlAs/InP heterostructure field-effect transistors" Fourth International Conference on Indium Phosphide and Related Materials, pp. 298–301 (1992), is incorporated herein by reference.

In step 112, a p-type dopant, such as zinc, is diffused in the stack 32 through the dielectric layer opening 44 and the cap layer opening 42 to form the recessed p-type region 36. The sidewall region 60 and the lower P+-type region 62 are formed, thus creating the p-n junction 38. The lower P+-type region 62 is heavily doped. In one embodiment of the present invention the lower P+-type region 62 concentration is approximately $2 \times 10^{18}/cm^3$. The depth D is accurately controlled, when diffusing the p-type dopant in the stack 32, by the diffusion time and temperature. Accuracy of depth D is dependent upon application of the APD 12 in high-speed telecommunication systems. Note that a single diffusion is performed in the above steps, unlike that of prior art, thereby reducing a need for floating field rings.

During etching of the dielectric layer 40 and during selectively etching of the cap layer 34, the shape of the sidewall region 60 may be controlled using the above stated techniques.

A second dielectric layer may be applied as an anti-reflection coating over the entire structure and metal contact openings and metal contacts formed as is well known in the art.

The above-described steps are meant to be an illustrative example, the steps may be performed synchronously or in a different order depending upon the application.

The present invention provides an APD that has reduced leakage current and improved reliability. The present invention also provides a method of forming an APD with a uniform epitaxially grown stack and cap layer and a uniform p-n junction, resulting in improved yields across the APD using a single diffusion, The present invention without the need for floating field rings, has reduced APD capacitance for a particular optically active area, which results in reduced costs in fiber-optic and APD alignment and thus reduced manufacturing costs of a transceiver.

The above-described apparatus, to one skilled in the art, is capable of being adapted for various purposes and is not limited to the following systems: vehicle systems, control systems, communication systems, semiconductor lasers, photodetectors, photodiodes, fiber optic receiver detectors, solar cells, or other systems or applications that may utilize a diffused junction semiconductor. The above-described invention may also be varied without deviating from the spirit and scope of the invention as contemplated by the following claims.

What is claimed is:

1. A recessed p-type region cap layer semiconductor comprising:

semiconductor substrate;

a semiconductor stack electrically coupled to said semiconductor substrate; and a non-guard ring cap layer electrically coupled to said semiconductor stack and comprising a recessed p-type region, said recessed p-type region forming a p-n junction with said semiconductor stack.

2. A semiconductor as in claim 1 wherein said semiconductor stack comprises at least one n-type layer.

3. A semiconductor as in claim 1 wherein said semiconductor stack comprises:

a buffer layer electrically coupled to said semiconductor substrate;

an absorption layer electrically coupled to said buffer layer;

a grading layer electrically coupled to said absorption layer;

a field control layer electrically coupled to said grading layer; and a multiplication layer electrically coupled to said field control layer and said non-guard ring cap layer.

4. A semiconductor as in claim 1 further comprising a passivating dielectric layer electrically coupled to said non-guard ring cap layer.

5. A semiconductor as in claim 4 wherein said passivating dielectric layer comprises a passivating dielectric layer opening corresponding to said recessed p-type region.

6. A semiconductor as in claim 5 wherein at least a portion of said passivating dielectric layer opening is formed using photolithography and a dry etching technique to expose at least a portion of said non-guard ring cap layer.

7. A semiconductor as in claim 4 wherein said passivating dielectric layer is formed of silicon nitride.

8. A semiconductor as in claim 1 wherein said recessed p-type region comprises:

a lower $P^+$-type region; and at least one $P^-$-type sidewall region.

9. A semiconductor as in claim 1 wherein said non-guard ring cap layer is formed of indium aluminum arsenide.

10. A semiconductor as in claim 1 wherein said recessed p-type region is formed using a wet etching technique to expose at least a portion of said semiconductor stack.

* * * * *